US009880900B2

(12) United States Patent
Reed et al.

(10) Patent No.: US 9,880,900 B2
(45) Date of Patent: Jan. 30, 2018

(54) METHOD FOR SCRUBBING AND CORRECTING DRAM MEMORY DATA WITH INTERNAL ERROR-CORRECTING CODE (ECC) BITS CONTEMPORANEOUSLY DURING SELF-REFRESH STATE

(71) Applicant: Nvidia Corporation, Santa Clara, CA (US)

(72) Inventors: David Reed, Saratoga, CA (US); Alok Gupta, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 87 days.

(21) Appl. No.: 14/963,023

(22) Filed: Dec. 8, 2015

(65) Prior Publication Data
US 2017/0161142 A1 Jun. 8, 2017

(51) Int. Cl.
| | |
|---|---|
| *H03M 13/00* | (2006.01) |
| *G06F 11/10* | (2006.01) |
| *G11C 29/04* | (2006.01) |
| *G11C 7/02* | (2006.01) |
| *G11C 11/406* | (2006.01) |
| *G11C 11/408* | (2006.01) |

(Continued)

(52) U.S. Cl.
CPC ........... *G06F 11/1068* (2013.01); *G11C 7/02* (2013.01); *G11C 11/4082* (2013.01); *G11C 11/4087* (2013.01); *G11C 11/4093* (2013.01); *G11C 11/40615* (2013.01); *G11C 29/04* (2013.01); *G11C 2029/0409* (2013.01); *G11C 2029/0411* (2013.01); *G11C 2029/4402* (2013.01); *G11C 2211/4062* (2013.01)

(58) Field of Classification Search
CPC .... G06F 11/1068; G06F 3/0619; G06F 3/064; G06F 3/0652; G06F 3/0659; G06F 3/0688; G11C 29/52
See application file for complete search history.

(56) References Cited

U.S. PATENT DOCUMENTS

| | | | |
|---|---|---|---|
| 4,319,356 | A | 3/1982 | Kocol et al. |
| 4,359,771 | A | 11/1982 | Johnson et al. |
| 4,380,812 | A | 4/1983 | Ziegler, II et al. |

(Continued)

FOREIGN PATENT DOCUMENTS

| | | |
|---|---|---|
| CN | 102789806 A | 11/2012 |
| CN | 204423920 U | 6/2015 |
| JP | 2007058966 A | 3/2007 |

OTHER PUBLICATIONS

Bhati et al. 'Flexible auto-refresh: enabling scalable and energy-efficient DRAM refresh reductions,' Jun. 13-17, 2015,ISCA '15 Proceedings of the 42nd Annual International Symposium on Computer Architecture;pp. 235-246.*

(Continued)

*Primary Examiner* — Guy Lamarre

(57) ABSTRACT

In one embodiment, a method for updating a DRAM memory array is disclosed. The method comprises: a) transitioning the DRAM memory array from an idle state to a self-refresh state after a period of inactivity; b) initiating a refresh on the DRAM memory array using DRAM internal control circuitry; and c) during the refresh, performing an Error Correction Code (ECC) scrub operation of selected bits in an activated row of the DRAM memory array.

20 Claims, 10 Drawing Sheets

(51) Int. Cl.
*G11C 11/4093* (2006.01)
*G11C 29/44* (2006.01)

(56) References Cited

U.S. PATENT DOCUMENTS

| | | | |
|---|---|---|---|
| 4,493,081 | A | 1/1985 | Schmidt |
| 4,694,454 | A | 9/1987 | Matsuura |
| 4,866,604 | A | 9/1989 | Reid |
| 4,888,773 | A | 12/1989 | Arlington et al. |
| 4,964,130 | A | 10/1990 | Bowden, III et al. |
| 5,127,014 | A | 6/1992 | Raynham |
| 5,263,032 | A | 11/1993 | Porter et al. |
| 5,329,629 | A | 7/1994 | Horst et al. |
| 5,495,491 | A | 2/1996 | Snowden et al. |
| 6,065,146 | A | 5/2000 | Bosshart |
| 6,167,551 | A | 12/2000 | Nguyen et al. |
| 6,199,139 | B1 | 3/2001 | Katayama et al. |
| 6,785,837 | B1 | 8/2004 | Kilmer et al. |
| 6,838,331 | B2 | 1/2005 | Klein |
| 6,859,415 | B2 | 2/2005 | Takatsuka et al. |
| 7,017,027 | B2 | 3/2006 | Inaba et al. |
| 7,099,221 | B2 | 8/2006 | Klein |
| 7,167,403 | B2 | 1/2007 | Riho et al. |
| 7,249,289 | B2 | 7/2007 | Muranaka et al. |
| 7,266,747 | B2 | 9/2007 | Foss |
| 7,287,138 | B2 | 10/2007 | Bland et al. |
| 7,315,970 | B2 | 1/2008 | Arakawa et al. |
| 7,318,183 | B2 | 1/2008 | Ito et al. |
| 7,382,673 | B2 | 6/2008 | Hummler |
| 7,385,849 | B2 | 6/2008 | Koga et al. |
| 7,526,713 | B2 | 4/2009 | Klein |
| 7,712,007 | B2 | 5/2010 | Nagai et al. |
| 7,900,120 | B2 | 3/2011 | Pawlowski et al. |
| 8,140,938 | B2 | 3/2012 | Ito et al. |
| 8,161,355 | B2 | 4/2012 | Fung et al. |
| 8,161,356 | B2 | 4/2012 | Bains et al. |
| 8,209,479 | B2 | 6/2012 | Rajan et al. |
| 8,301,980 | B2 | 10/2012 | Gruner et al. |
| 8,347,171 | B2 | 1/2013 | Sec |
| 8,539,310 | B2 | 9/2013 | Sasaki |
| 8,621,324 | B2 | 12/2013 | Suh |
| 9,053,813 | B2 | 6/2015 | Kang et al. |
| 9,070,473 | B2 | 6/2015 | Bedeschi et al. |
| 9,286,161 | B2 | 3/2016 | Pawlowski |
| 9,411,678 | B1 | 8/2016 | Ware et al. |
| 9,444,495 | B2 | 9/2016 | Takefman et al. |
| 9,472,261 | B1 | 10/2016 | Chun et al. |
| 2003/0191888 | A1 | 10/2003 | Klein |
| 2004/0170060 | A1 | 9/2004 | Ishimoto |
| 2006/0282755 | A1 | 12/2006 | Oh |
| 2008/0298154 | A1 | 12/2008 | Mae |
| 2011/0122716 | A1 | 5/2011 | Pyo et al. |
| 2012/0317352 | A1* | 12/2012 | Kang ............... G11C 11/40611 711/106 |
| 2014/0146624 | A1 | 5/2014 | Son et al. |
| 2016/0026524 | A1 | 1/2016 | Hoya |
| 2016/0055052 | A1 | 2/2016 | Hu et al. |
| 2017/0109232 | A1* | 4/2017 | Cha ....................... G06F 11/106 |

OTHER PUBLICATIONS

DRAM's Damning Defects—and How They Cripple Computers; http://spectrum.ieee.org/computing/hardware/drams-damning-defects-and-how-they-cripple-computers; by Ioan Stefanovici et al; Nov. 23, 2015.
Memory Information fo the PowerEdge C1100; http://www.dell.com/support/article/in/en/inbsdt1/SLN156721; Nov. 12, 2015.
Check-bit-reduced codewords using non-2n data bits for ECC-based self-refresh enhancement techniques in DRAMs; S.Cha et al., Electronics Letters Oct. 28, 2010 vol. 46 No. 22.
FMA Support for AMD Opteron rev F; Gavin Maltby's Oracle Blog by User12652883—Oracle on Oct. 24, 2006.
Low Power embedded DRAM caches using BCH code partitioning; Reviriego et al., http://ieeexplore.ieee.org/document/6313845/; On-Line Testing Symposium (IOLTS), 2012 IEEE 18th International.
Flexible Auto-Refresh: Enabling Scalable and Energy-Efficient DRAM Refresh Reductions; Ishwar Bhati; et al.; Oracle Corporation, Intel Corporation, University of Maryland; ISCA' Jun. 13-15, 2015, Portland, OR USA.

* cited by examiner

METHOD FOR SCRUBBING AND CORRECTING DRAM MEMORY DATA WITH INTERNAL ERROR-CORRECTING CODE (ECC) BITS CONTEMPORANEOUSLY DURING SELF-REFRESH STATE

CROSS-REFERENCE TO RELATED APPLICATIONS

Related Applications

The present application is also related to U.S. patent application Ser. No. 14/963,035, filed Dec. 8, 2015, entitled "CONTROLLER-BASED MEMORY SCRUB FOR DRAMS WITH INTERNAL ERROR-CORRECTING CODE (ECC) BITS CONTEMPORANEOUSLY DURING AUTO REFRESH OR BY USING MASKED WRITE COMMANDS," naming David Reed and Alok Gupta as inventors. That application is incorporated herein by reference in its entirety and for all purposes.

The present application is also related to U.S. patent application Ser. No. 14/963,067, filed Dec. 8, 2015, entitled "METHOD FOR MEMORY SCRUB OF DRAM WITH INTERNAL ERROR-CORRECTING CODE (ECC) BITS DURING EITHER MEMORY ACTIVATE AND/OR PRE-CHARGE OPERATION" naming David Reed and Alok Gupta as inventors. That application is incorporated herein by reference in its entirety and for all purposes.

BACKGROUND OF THE INVENTION

Traditionally, in Dynamic Random Access Memories (DRAMs), small weaknesses of some memory cells or external disturbances like electromagnetic or particle radiation can cause unavoidable random bit-flips. The error rate can typically increase with age and increased use of the memory. Bit-errors can result in system crashes, but even if a bit-error does not result in a system crash, it may cause severe problems because the error can linger in the system causing incorrect calculations and multiply itself into further data. This is problematic especially in certain applications, e.g., financial, medical, automotive, etc. The corrupted data can also propagate to storage media and grow to an extent that is difficult to diagnose and recover. Most DRAM errors are transient and disappear after rebooting the system, while the resulting damage lingers.

Accordingly servers and other high reliability environments are currently integrating Error Correcting Code (ECC) into their memory subsystems to protect against the damage caused by such errors. ECC is typically used to enhance data integrity in error-prone or high-reliability systems. Workstations and computer server platforms have buoyed their data integrity for decades by adding additional ECC channels to their data buses. Mainstream computing devices such as home computers, tablets, and smart phones rely on the low baseline bit error rate of commodity DRAM and do not implement robust, or any, error correction. When a DRAM data failure occurs in one of those devices, it causes silent corruption or potentially a device crash forcing a reboot.

Typically ECC adds a checksum stored with the data that enables detection and/or correction of bit failures. This error correction can be implemented, for example, by widening the data-bus of the processor from 64 bits to 72 bits to accommodate an 8-bit checksum with every 64-bit word. The memory controller will typically be equipped with logic to generate ECC checksums and to verify and correct data read from the memory by using these checksums.

Until now, DRAMs have not performed any error correction internal to the DRAM device. DRAM ECC has always been performed externally by the addition of data (more DRAM devices) to create a wider channel. As process nodes shrink, especially in the case of mobile applications, the stored charge per bit is becoming increasingly smaller and, therefore, more susceptible to both internal and external noise.

Non-volatile memories have an even higher likelihood of errors than DRAM. Those devices have added large numbers of additional bits per block to allow for the repair of errors. The repair itself, however, occurs in the flash memory controllers, not in the flash memory itself.

Hence, the DRAM industry is preparing to add ECC internal to the DRAM as they approach the 20 nm node and smaller process nodes. However, as DRAM vendors move towards integrating ECC, they are doing so only with the aim to correct bits during a READ operation and not to repair the internal arrays. Accordingly, for systems that wish to leave their devices powered for a longer period of time there is still a risk of data corruption leading to uncorrectable errors.

BRIEF SUMMARY OF THE INVENTION

Accordingly a need exists for a method and apparatus to augment the correction capability envisioned for the DRAM with a repair method that adds additional resilience and provides the DRAM with long-term operational reliability.

The problem with conventional DRAMs is that internal ECC can detect and correct errors during a read operation, but it does not write the data back into the memory array. This behavior causes the error to stay resident inside the memory array across multiple accesses and may contribute to a DRAM failure at a later time when additional errors occur. For example, in the case of DRAM being powered continuously for long periods (e.g. the lifetime of an automobile which may be 10-20 years) there is an increased probability of a second failure occurring in the same 'word' as a first failure. The first failure may lie silently for years as the DRAM internal ECC logic repairs the error every time the data word is read. When a second (or third or fourth . . . ) error hits the same word, the internal ECC circuitry is unable to repair the word and corrupted read data is provided to the system.

Embodiments of the present invention advantageously address this issue by repairing or "scrubbing" the errors. It should be noted that scrubbing is generally the term used in server memory controllers for a circuit that operates in the background reading every address looking for errors and repairing (and potentially logging the address and type of failure of) those that it finds.

Embodiments of the present invention scrub the errors by writing the corrected data back to the appropriate location in memory and updating the memory array with corrected data in addition to reading out the corrected version. For example, during a refresh or self-refresh cycle, instead of simply reading the data from the selected row into the sense amplifiers and writing it back into the corresponding row, the data is instead passed through an ECC correction module before being written back into the sense amplifiers and through the sense amplifiers into the corresponding row in the memory array. Accordingly, embodiments of the present invention perform an "ECC scrub" by reading existing data from the selected row in a given bank, checking and correcting data based on the ECC bits, and updating the memory bank with corrected data.

For example, while in the self-refresh state the DRAM periodically activates a page into its sense amps and precharges the page back into the memory array. This is necessary because the bit charge storage leaks away over time requiring it to be constantly refreshed. In contemporary DRAMs each page is refreshed approximately every 32 ms. During that time every page is activated and precharged at least once. Such a rotation of accesses through memory is similar to that performed by a traditional ECC scrub engine and is leveraged in the present invention.

In one embodiment, a method for updating a DRAM memory array is disclosed. The method comprises: a) transitioning the DRAM memory array from an idle state to a self-refresh state; b) initiating a refresh on the DRAM memory array using DRAM internal control circuitry; and c) during the refresh, performing an Error Correction Code (ECC) scrub operation of selected bits in an activated row of the DRAM memory array.

In another embodiment, a method for updating a DRAM memory array is disclosed. The method comprises: a) transitioning the DRAM memory array from an idle state to a self-refresh state; b) initiating a refresh on the DRAM memory array using DRAM internal control circuitry; and c) during the refresh, performing an Error Correction Code (ECC) scrub operation of selected bits in an activated row of the DRAM memory array, wherein the selected bits comprise multiple words.

In a different embodiment, an apparatus for updating a DRAM memory is disclosed. The apparatus comprises a DRAM memory array, wherein the DRAM memory array is configured to: a) transition the DRAM memory array to a self-refresh state from an idle state; b) initiate a refresh on the DRAM memory array using DRAM internal control circuitry; and c) during the refresh, performing an Error Correction Code (ECC) scrub operation of selected bits in an activated row of the DRAM memory array.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
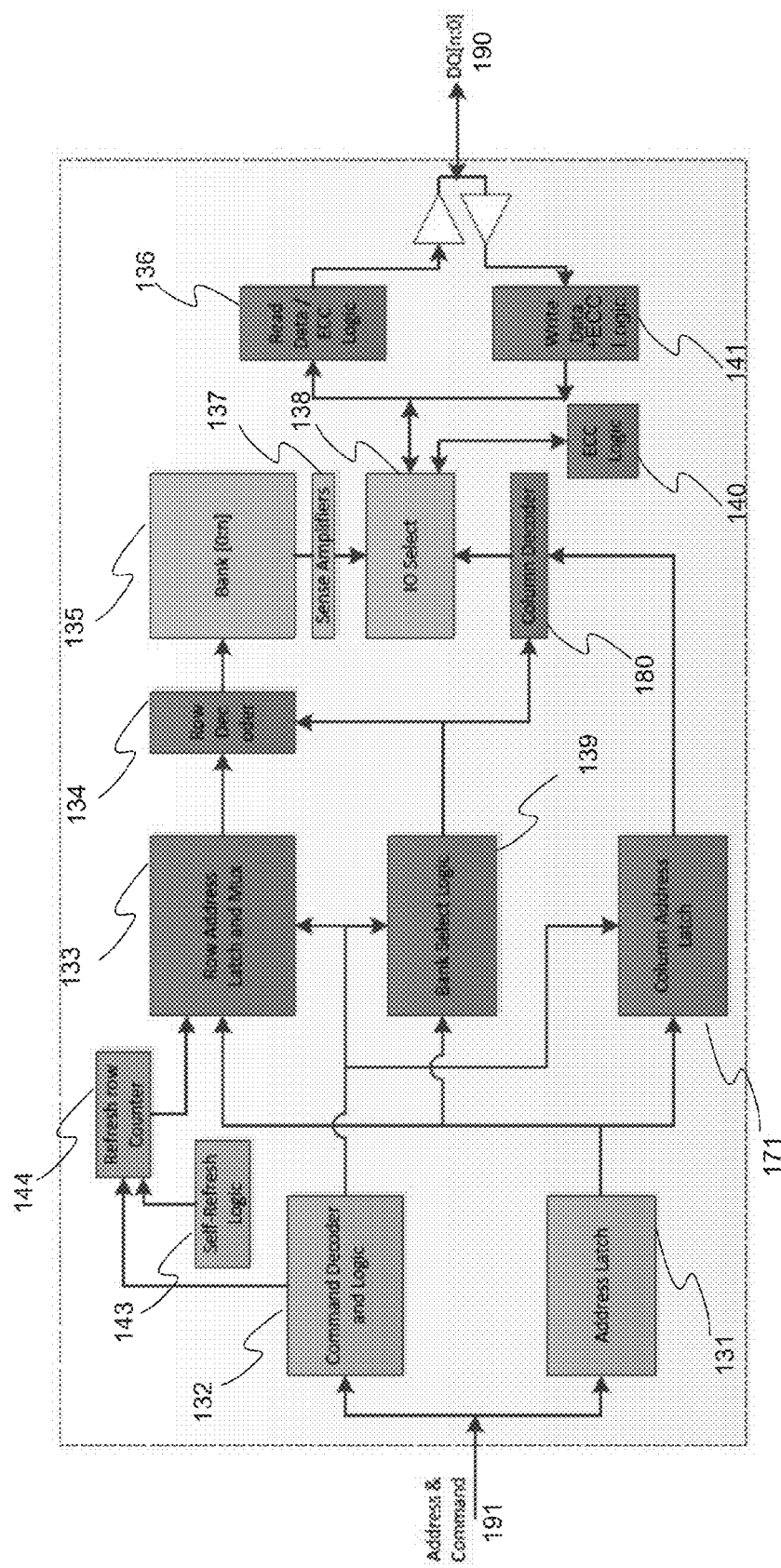
FIG. 1 is a hardware block diagram illustrating a conventional DRAM.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "transitioning", "performing," "incrementing," and "repeating" or the like, refer to actions and processes (e.g., flowchart of FIG. 8) of a computer system or similar electronic computing device or processor. The computer system or similar electronic computing device manipulates and transforms data represented as physical (electronic)

quantities within the computer system memories, registers or other such information storage, transmission or display devices.

Method for Scrubbing and Correcting Dram Memory Data with Internal Error-Correcting Code (ECC) Bits Contemporaneously During Self-Refresh State Embodiments of the present invention provide methods and apparatus to augment the correction capability envisioned for the DRAM with a repair method that adds additional resilience and provides the DRAM with long-term operational reliability.

DRAM is a type of random-access memory that stores each bit of data in a separate capacitor within an integrated circuit. The capacitor can either be charged or discharged, indicating a value of 1 or 0. Since the charge on a DRAM cell weakens over time due to a number of factors including temperature, the capacitors will slowly discharge, and the information eventually fades.

In order to prevent this from happening DRAM needs to be periodically refreshed by boosting the charge contained in each individual memory cell. The frequency with which the refresh needs to occur depends on the silicon technology used to manufacture the core memory die and the design of the memory cell itself. To prevent data loss, all bit cells of the DRAM memory must be refreshed within a specified refresh interval using a series of Refresh operations.

FIG. 1 is a hardware block diagram illustrating a conventional DRAM. Addresses 191 are received and latched into the address latch 131 while commands 191 are received and decoded by command decoder and logic module 132. The row address is latched into the row address latch and multiplexer module 133 while the column address is latched into the column address latch module 171.

To reduce access latency, DRAM is split into multiple equal-sized units called banks. Most DRAM chips have a multi-bank architecture and can be organized in banks, rows, and columns. Bank select logic module 139 selects the appropriate bank from Bank [0:n] 135 for access using the address information. A typical 512 MBit SDRAM chip, for example, comprises 4 independent 128 Mbit memory banks. Each row in a bank is an array of 16,384 bits each. A bank is either idle, active, or changing state from one to the other.

Using row decoder 134, the row address is applied to the selected bank from Bank [0:n]. The row address decoder selects the proper row to be sent to the sense amplifiers 137. The "active" command activates an idle bank. For example, it can present a two-bit bank address and a 13-bit row address and cause a read of that row into 16,384 column sense amplifiers 137. This is also referred to as "opening" the row or "opening" a page.

Sense amplifiers 137 are also known as "row-buffers" and provide access to the row, which is open at the bank. Before a memory location can be read, the entire row containing that memory location is opened and read into the row buffer. The page (row) data stays in the row buffer until the page is explicitly closed. If an access to the open page data arrives at the memory controller, it can be serviced immediately from the row buffer. If an access to another row in that bank arrives at the memory controller, the current row must be closed and the new row must be opened before the request can be forwarded to the DRAM for servicing.

Once the row has been activated, "read" and "write" commands are possible to that row. Both read and write commands require a column address. The column address is provided using column decoder 180 to I/O select module 138. For a read operation requested data is then read and error corrected using Read Data/ECC Logic module 136 before the output data is placed on the DQ lines 190. For a write operation, ECC is computed and write data and computed ECC are written to the row buffer at the selected column address. In one embodiment, Write module 141 can also generate the ECC check bits. In a different embodiment, a separate module in the write data path can generate the ECC check bits.

It should be noted that while the ECC module 136 error corrects the data before outputting it during a read operation, the correct data is never written back into the sense amplifiers nor to the corresponding row being read out from the selected bank 135. This is problematic because if the ECC logic detects and corrects an error it never writes the data back to the row buffer nor DRAM bank 135. Accordingly, if at a later time more bits fail in that row, the existing and subsequent errors could go undetected. Not being able to repair the bad bit is problematic because if more bits per word fail, it can result in data errors propagating through the entire system. ECC logic 140 is optionally used to calculate the checksum for the written data at the selected column and data is written into the row buffer 137.

A write command is accompanied by the data to be written driven on to the DQ lines 190. It is the duty of the memory controller to ensure that the DRAM is not driving read data on to the DQ lines at the same time that it needs to drive write data to those lines. The data is written into sense amplifiers 137 through IO select module 138 using write data module 141. Again, column decoder 180 is used to select the appropriate column to which data can be written. During a write to a particular cell, all the columns in a row are sensed simultaneously just as during reading, so although only a single column's storage-cell capacitor charge may be changed, the entire row is refreshed (written back in). ECC logic 140 is used to calculate the checksum for the written data before the column is selected and data is written into the row buffer 137.

As mentioned previously, the charge on the DRAM memory cells will dissipate away naturally over time due to many factors that can influence the leakage rate including temperature. A marked reduction in stored charge can result in data loss. In order to prevent this from happening, the DRAM must be periodically refreshed by boosting the charge contained in each individual memory cell. Typically, manufacturers specify that each row must have its storage cell capacitors refreshed every 64 ms or less.

The activate (ACT) and precharge (PRE) bounding a read (RD) or write (WR) to a memory cell has the same effect as refreshing the selected cell by issuing a Refresh (REF) command. Because not all cells are written to during the normal course of operation, there is no guarantee every word on a page has error-checked data when it is restored. In most cases, refresh cycles involve restoring the charge along an entire page. Over the course of the entire DRAM Refresh interval, every page is accessed and subsequently restored. At the end of the interval, the process begins again.

DRAMs will typically also comprise a refresh row counter 144 to keep track of the last row that was refreshed—this row counter is used to determine the rows that must be refreshed next. A bank must be idle for a minimum period before the Refresh (REF) command can be applied. The refresh command is generated by circuits in the memory controller. The refresh counter 144 typically contains the address of the row to be refreshed which is applied to the chip's row address lines and the counter increments after completion of a refresh operation. When a refresh has completed, the corresponding bank is left in idle state. Some memory controllers may use a Refresh All command which refreshes all banks in the DRAM simultaneously. Others may use the per-bank refresh command and to handle independent bank refresh, the DRAM may have a copy of counter 144 per bank.

When a DRAM is not being actively utilized it can be transitioned to a low power mode during which the DRAM internally performs a periodic refresh to maintain data integrity also known as a self-refresh. This can be performed by the memory controller issuing a Self-Refresh command to sequence the DRAM into Self-Refresh state. The memory controller does not initiate an explicit Refresh when DRAM is in self-refresh state. Typically, self-refresh logic module 143 is used in conjunction with the DRAMs internal refresh row counter 144 to keep track of the rows being refreshed. Self Refresh Logic 143 contains timing logic to periodically trigger new internal refresh operations.

Figure 2:
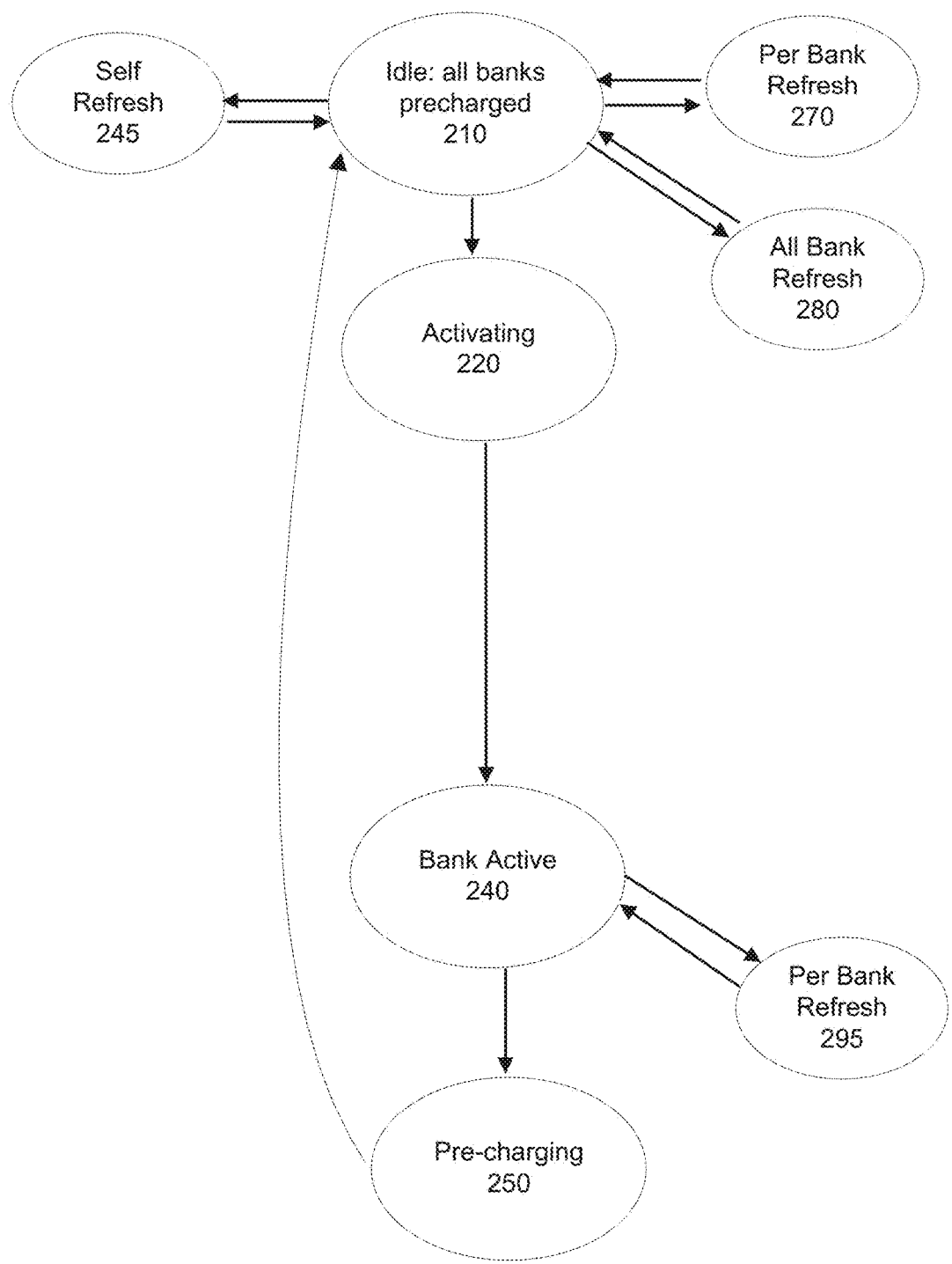
FIG. 2 is a state diagram illustrating a subset of the operation of a conventional DRAM.

FIG. 2 is a state diagram illustrating a subset of the operation of a conventional DRAM. Before the DRAM is ready to respond to read and write commands, a bank must first be opened (activated). The memory controller accomplishes this by sending the appropriate command (ACT), specifying the rank, bank, and page (row) to be accessed. The "active" command activates an idle bank and transitions the memory from idle state 210 to activating state 220. At state 240, the bank is active and the open bank contains within the sense amplifiers a complete page of memory that is typically 1-8 KB in length.

In the active state, the memory controller can issue a per bank refresh command to a different idle bank causing the DRAM to transition to state 295. It should be noted that a per-bank refresh command may only be available in certain types of DRAM, e.g., LPDDR (low power DDR) DRAM. If the DRAM supports the enhanced mode of per-bank refresh, the per-bank refresh mode can refresh cells at the bank level. This allows a bank to be accessed while another bank in the DRAM is being refreshed. For example, rows in multiple banks can be refreshed in state 295 in a round robin fashion without stalling DRAM read or write access.

Only one page per bank may be open at a time. Access to other pages in the same bank demands the open page first be closed. As long as the page remains open the memory controller can issue any combination of READ or WRITE commands, until such time as the open page is no longer needed or, for example, a pending request to read/write data from an alternate page in the same bank requires the current page be closed so that another may be accessed. This is done by either issuing a Precharge (PRE) command to close the specified bank only or a Precharge All (PREA) command to close all open banks in the device.

Upon receiving a Precharge command from the memory controller, the memory transitions from state 240 to Precharging mode 250. Precharging prepares the data lines and sense circuitry to transmit the stored charge in the sense amplifiers back into the row of individual memory cells undoing the previous destructive read.

Subsequent to precharging, a bank transitions to idle mode 210. From idle mode, the memory controller can command the memory to perform a per bank refresh in state 270 or an all bank refresh in state 280. As stated above, the DRAM can also be switched to a low power self-refresh mode 245 during which the DRAM internally performs periodic refresh.

Figure 3:
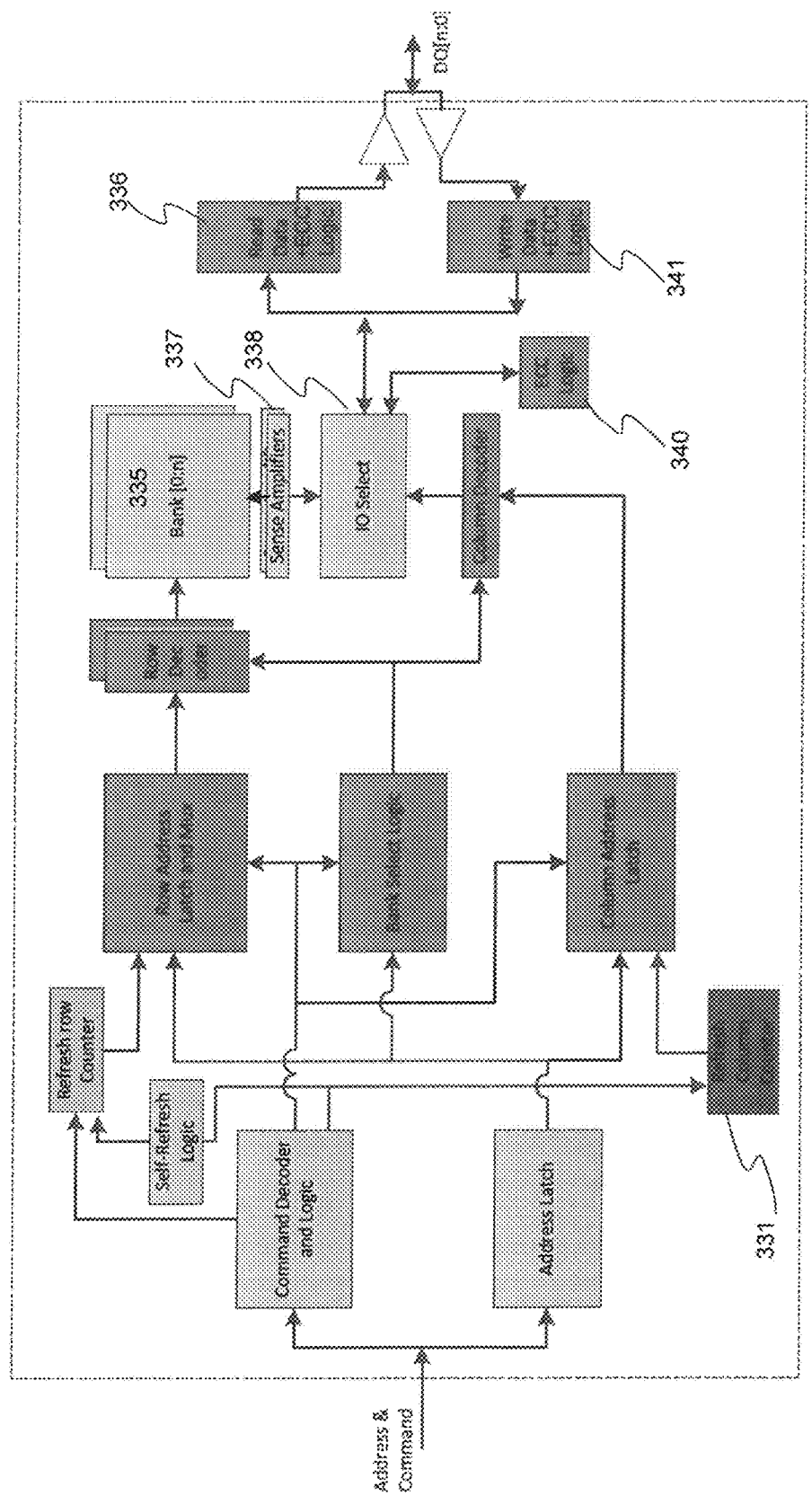
FIG. 3 is a hardware block diagram illustrating a DRAM that can update a memory array with corrected data from an ECC scrub during a refresh or a self-refresh cycle in accordance with an embodiment of the present invention.

FIG. 3 is a hardware block diagram illustrating a DRAM that can update a memory array with corrected data from an ECC scrub during a refresh or a self-refresh cycle in accordance with an embodiment of the present invention.

As mentioned above, the problem with conventional DRAMs is that even if the ECC module exists, it can detect and correct errors but it does not write the corrected data back into the sense amplifiers 137. This leads to errors that stay resident and uncorrected forever inside the DRAM storage array 135. Accordingly, if over time more bits fail in a row, the errors will accumulate and may cause the DRAM to transmit incorrect data.

Embodiments of the present invention advantageously address this issue by scrubbing the errors. In other words, embodiments of the present invention write the corrected data back to the appropriate row in memory and update the memory with corrected data instead of simply reading out the corrected version. For example, during a refresh or self-refresh cycle, instead of simply reading the data from the selected row into the sense amplifiers 337 and writing it back into the corresponding row, selected data is additionally passed through the I/O select module 338 and ECC-corrected using ECC Logic module 340 before being written back into the sense amplifiers 337 and through the sense amplifiers into the corresponding row of its bank 335. Accordingly, embodiments of the present invention perform an ECC scrub by reading existing data from the selected row in a given bank, checking and correcting data based on the ECC bits, and updating the memory bank with corrected data.

In one embodiment, instead of passing the data through 10 select module 338 and using ECC logic module 340, a different module can be configured to perform an ECC scrub by reading existing data from the selected row in the given bank, checking and correcting data based on the ECC bits, and updating the memory bank with corrected data In one embodiment, the DRAM will comprise an additional component, the refresh column counter 331 as illustrated in FIG. 3. The refresh column counter 331 may be used to select one or more data words on which to perform an ECC scrub. A "word" quanta for performing an ECC scrub is typically equivalent to 256 bits (referred to herein as an "ECC word"). For example, in one embodiment only a single word may be scrubbed during a refresh cycle, while in a different embodiment multiple or all the words in a page may be scrubbed. When a DRAM performs a "read" it grabs the entirety of the burst. In one embodiment, there is a 16 bit bus and the burst length (BL) is 16. Hence 16*16b are transmitted during a burst and those 256 bits comprise a 'word.' This is the data quanta that is fetched from the sense amplifiers along with the associated ECC data.

For LPDDR4, DRAM vendors plan to implement ECC on two paths. During write, ECC bits are created from the full unmasked data burst or a combination of the masked data burst and current contents of the bank/row/column. During a read, corrected data is produced from the data and the ECC stored in the DRAM array.

As mentioned above, embodiments of the present invention advantageously "scrub" the errors, by writing the corrected version back to memory, which lowers the possibility of an error staying resident in the DRAM. In other words, embodiments of the present invention implement a background repair mechanism re-using the existing ECC blocks used for Read/Write operations during Self Refresh and All Bank Refresh mode. If the DRAM ECC implementation is per-bank, then embodiments of the present invention can also perform a scrub during the Per Bank Refresh mode.

Embodiments of the present invention are, therefore, especially advantageous for DRAMs used in systems that are meant to be powered continuously for years at a time. The DRAMs perform an ECC scrub in self-refresh mode, for example, and lower the chances of errors accumulating over time. Without embodiments of the present invention, SOC designers would have to implement additional DRAM channels dedicated for ECC data and a dedicated scrubber in the SOC and consume additional power waking up the DRAM and explicitly scrubbing the entire array periodically.

Figure 4:
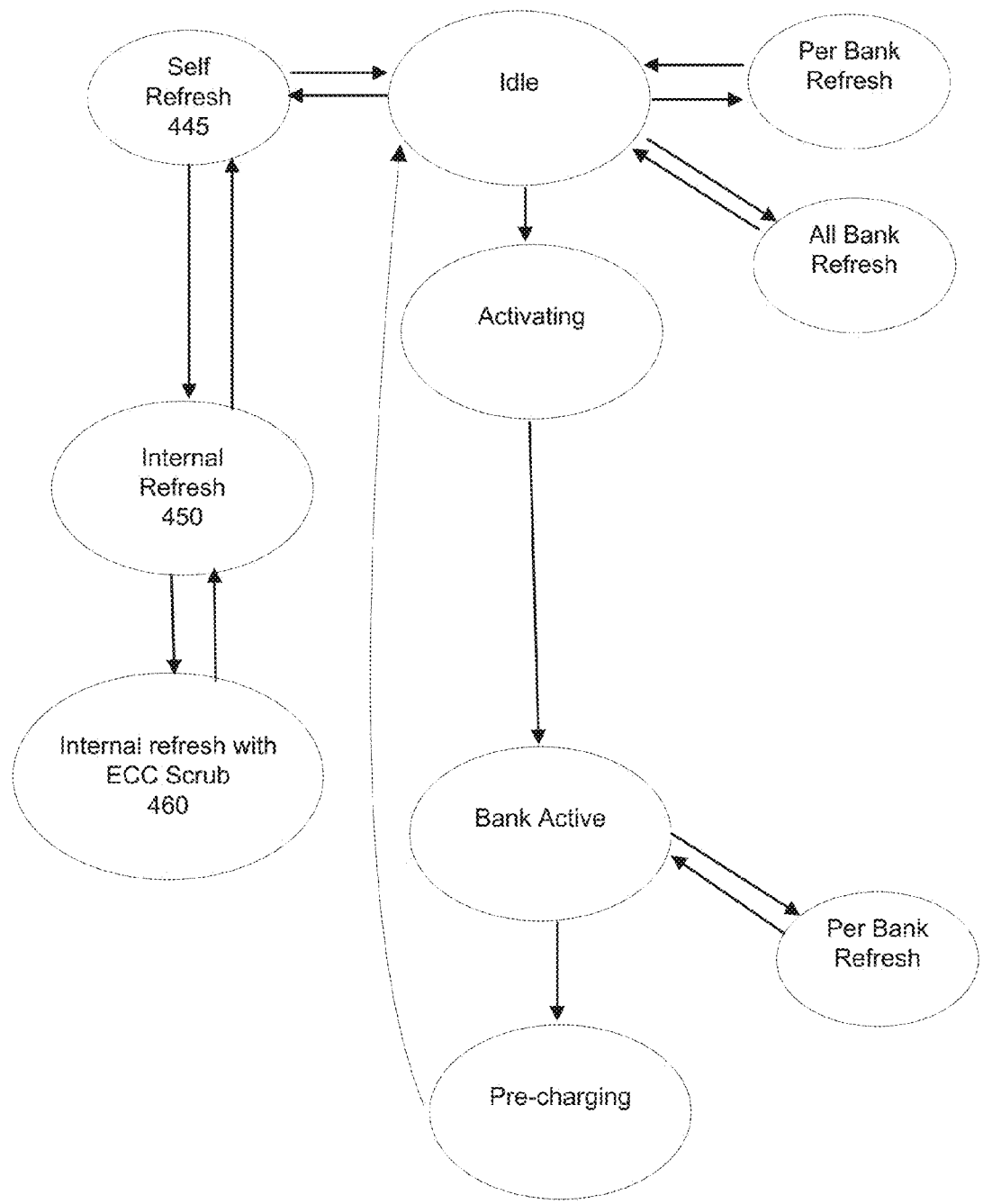
FIG. 4 is a state diagram illustrating the operation of a DRAM that can perform an ECC scrub in self-refresh mode in accordance with an embodiment of the present invention.

FIG. 4 is a state diagram illustrating the operation of a DRAM that can perform an ECC scrub in self-refresh mode in accordance with an embodiment of the present invention. As mentioned above, if the DRAM is idle, the memory controller can transition the DRAM to a low power self-refresh mode 445 during which the DRAM internally performs a periodic refresh to maintain data integrity.

A single bank refresh is equivalent to an Activate and Precharge operation with no read or write using an internal row counter instead of a row address provided by the memory controller. During the self-refresh cycle 445, the DRAM will self-initiate refresh cycle 450. Embodiments of the present invention perform a virtual read and write operation during refresh cycle 450 that re-circulates data from the sense amplifier through the ECC repair/generation logic and stores it back to the sense amplifier prior to the implicit Precharge operation.

The virtual read and write operation constitutes an ECC scrub and is performed in state 460 as shown in FIG. 4. The refresh column counter 331 can be used to keep track of the columns that have been scrubbed. Either one or more columns can be scrubbed during any given self-refresh cycle. In other words, the DRAM will automatically scrub one or more columns over all the rows during one complete interval of an internally generated refresh cycle. This operation will automatically correct for any bit errors in the given column or columns based on associated error correction data.

Optionally the DRAM may store the address of any word containing an error in a register or other temporary storage for higher level system software to take action on. On the next self-refresh internal refresh interval, the next column or set of columns is updated. The refresh column counter is incremented accordingly (based on the number of columns refreshed) to maintain and keep track of the column to be updated during subsequent self-refresh internal refresh intervals. Depending on scrubbing interval requirement, different algorithms can be implemented on when, and by how much to increment the refresh column counter. If the memory controller leaves the DRAM in the Self Refresh state for a sufficient period of time, the scrub process will check and repair all bits in the DRAM (all the banks in the DRAM memory) and the process will start all over again. As mentioned above, the DRAM enters self-refresh mode when it is idle so the memory controller is not involved in the refresh process or the accompanying ECC scrub taking place in state 460. In one embodiment, the time delay between internally generated refresh operations is minimized to accelerate the scrubbing of multiple pages.

The additional hardware for a DRAM that can perform an ECC scrub in self-refresh mode is a refresh column counter 331 to select one or more columns from the activated row incremented once per complete cycle through all the rows and banks. In other words, the refresh column counter can be incremented by the ECC word size at the end of a cycle through all the rows and banks so that the next ECC word column can be selected for an ECC scrub. In the instance where multiple ECC words are scrubbed in a given cycle, the column counter is incremented in increments of more than one ECC word. In one embodiment where there is only a single ECC logic path that is not per-bank, and the internal refresh cycles are executed on all banks, a bank counter may also be required, wherein the looping bank counter is incremented once per complete cycle through all the rows.

Figure 5:
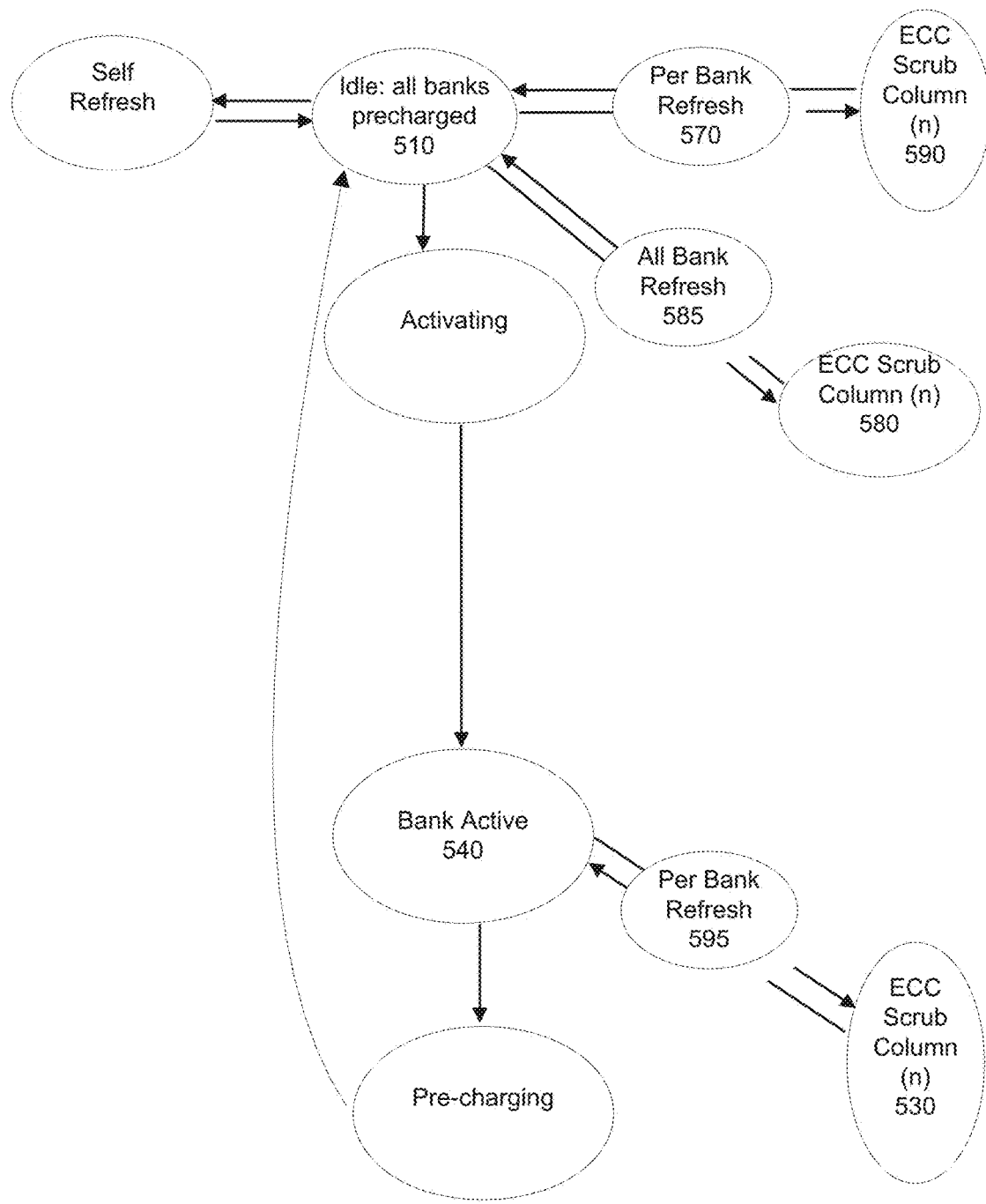
FIG. 5 is a state diagram illustrating the operation of a DRAM that can perform an ECC scrub during a refresh cycle as initiated by the memory controller in accordance with an embodiment of the present invention.

FIG. 5 is a state diagram illustrating the operation of a DRAM that can perform an ECC scrub during a refresh cycle as initiated by the memory controller in accordance with an embodiment of the present invention. In one embodiment, the DRAM can perform an ECC scrub of the memory array during a regular refresh cycle. Similar to the self-refresh embodiment discussed above, the ECC scrub is performed for each column and is repeated for all the columns across all pages to correct for bit errors. In other words, the controller periodically instructs the DRAM to perform a refresh cycle and during that cycle the DRAM performs a scrub operation. As subsequent refresh cycles are executed as is required by the standard DRAM operation, the internal counters perform a scrub across all the rows in all banks. Then, subsequently, the DRAM advances the column counter by one word (or multiple words) and performs the same action for the next column (or set of columns) and keeps repeating this process until the entire memory is updated for all banks, rows and columns. Like the self-refresh embodiment, DRAM can implement a column counter internally. In other embodiments, the DRAM protocol can be updated and controller can provide the explicit column address with Refresh command.

As discussed above, DRAMs need to be periodically refreshed by boosting the charge contained in each individual memory cell. A typical DRAM memory needs to be refreshed once every 16-64 ms. In one embodiment, a memory controller can initiate a refresh cycle. For example, as shown in FIG. 5, from idle state 510, a memory controller can command the DRAM to either perform a per bank refresh in state 570 or an all bank refresh in state 585. An ECC scrub can be performed in state 590 during a per bank refresh or it can be performed in state 580 during an all bank refresh. Depending upon how many copies of ECC scrub logic are included in a DRAM, the all bank refresh may only scrub a subset of the total banks during each refresh all banks operation. A bank counter would point to the current bank(s) to be scrubbed during the current refresh all banks operation. This counter would be incremented by the number of banks that can be scrubbed during a refresh all cycle following a complete pass through all rows. This would permit the DRAM to scrub all rows in all banks for the current column address pointer.

If, for example, a refresh cycle is performed every 64 ms and there are 64 ECC words in a row, the entire memory array can be scrubbed in 4,096 ms (64×64). It should be noted that for a scrub to be performed in the all bank refresh state 585 additional ECC logic would be required in order to accommodate multiple banks being scrubbed at the same time or the scrub time is extended by the multiple required for the bank counter to loop.

In one embodiment, an ECC scrub 530 may also be performed during the bank active state 540 as well. For example, if row 0 is active, a per bank refresh 595 with an ECC scrub 530 can be performed on a row of an inactive bank.

A memory controller initiated ECC scrub works similarly to a scrub performed during self-refresh mode, however, the refresh is initiated by the memory controller instead of self-initiated by the DRAM using internal logic in Self-Refresh state. As explained above, refresh cycles initiated during a self-refresh mode are managed internally by the DRAM during the idle state and are not initiated by the memory controller. Similar to the self-refresh embodiment discussed above, the only additional hardware required for an ECC scrub to be performed during a memory controller initiated refresh cycle 570 or 585 is a refresh column counter 331 and, optionally, a bank counter. However, for a per-bank refresh initiated while the DRAM is in Bank Active state 540, a secondary scrub path may be necessary since the ECC logic in the data path 336, 341 may be busy with data operations from an active bank.

Additionally, similar to an ECC scrub in self-refresh mode, during a controller initiated refresh cycle, embodiments of the present invention can perform a virtual read and write operation that re-circulates data from the array through the ECC repair/generation logic and stores it back to the array prior to the implicit Precharge operation. The ECC scrub is performed in either states 590, 580, or 530 as shown in FIG. 5. The refresh column counter 431 can be used to keep track of the column (or columns) that have been scrubbed in a given cycle.

In this embodiment, the refresh column counter can be controlled by the memory controller. Either one or more columns can be scrubbed during a refresh cycle. The memory controller issues a refresh command with a internally managed column counter similar to refresh column counter 431. It provides the value of this column counter to the DRAM with the Refresh commands forcing a scrub cycle for the selected column. If that command is a refresh all banks command, the memory controller may also provide a bank number to be scrubbed to the DRAM.

In one embodiment, the hardware to perform the re-circulating read/write operations should already be present in DRAM designs since it is a subset of the Masked Write (Read-Modify-Write) operation where all the byte enables are inactive. The virtual read and write will effectively act as a scrubber to correct bit errors. The virtual read and write also lowers the possibility of an uncorrectable error persisting and increasing the probability of future failures.

During a Masked Write or Partial Write operation data is first read from a selected column and corrected for any errors using the stored ECC bits and subsequently merged with the incoming partial write data. This operation is sometimes also referred to as Read-Modify-Write. ECC is recomputed on the merged data before this data is written back to DRAM array. In one embodiment the memory controller can issue Masked Writes with all the byte enables inactive (effectively a Null partial write command), effectively using the built-in mechanism to perform a scrub operation of the memory.

In this scheme, the memory controller issues a Null partial Write to memory forcing a column in the activated row to be read and ECC checked. If there is an error detected, the data is corrected. Subsequently, the ECC is re-computed and the corrected data is written back into memory. After a column is scrubbed, the column counter inside the memory controller is incremented and during the next cycle, the subsequent column is scrubbed. This operation is repeated until all the columns are scrubbed. In this fashion, the memory is automatically updated for bit errors. In this embodiment any DRAM can be used off-the-shelf because the logic to scrub DRAM resides in the memory controller.

In one embodiment, the ECC scrub operation can be performed by using a Masked Write operation (a Read-Modify-Write command with all the byte enables inactive) initiated by the memory controller. The memory controller would have to force null partial write operations to the selected column after activating a given row in order for the entire chunk of data in the selected column to get scrubbed. This process would be repeated for each of the columns aligned to the ECC word size until all the columns are scrubbed. In a different embodiment, a dedicated column command instead of using a Masked Write operation can be transmitted by the controller in order to initiate the ECC scrub.

Accordingly, both embodiments discussed in FIGS. 4 and 5 can be used to silently scrub the DRAM array leveraging the refresh cycles which are guaranteed to occur or by inserting dedicated Masked Write cycles in the DRAM traffic.

Figure 6:
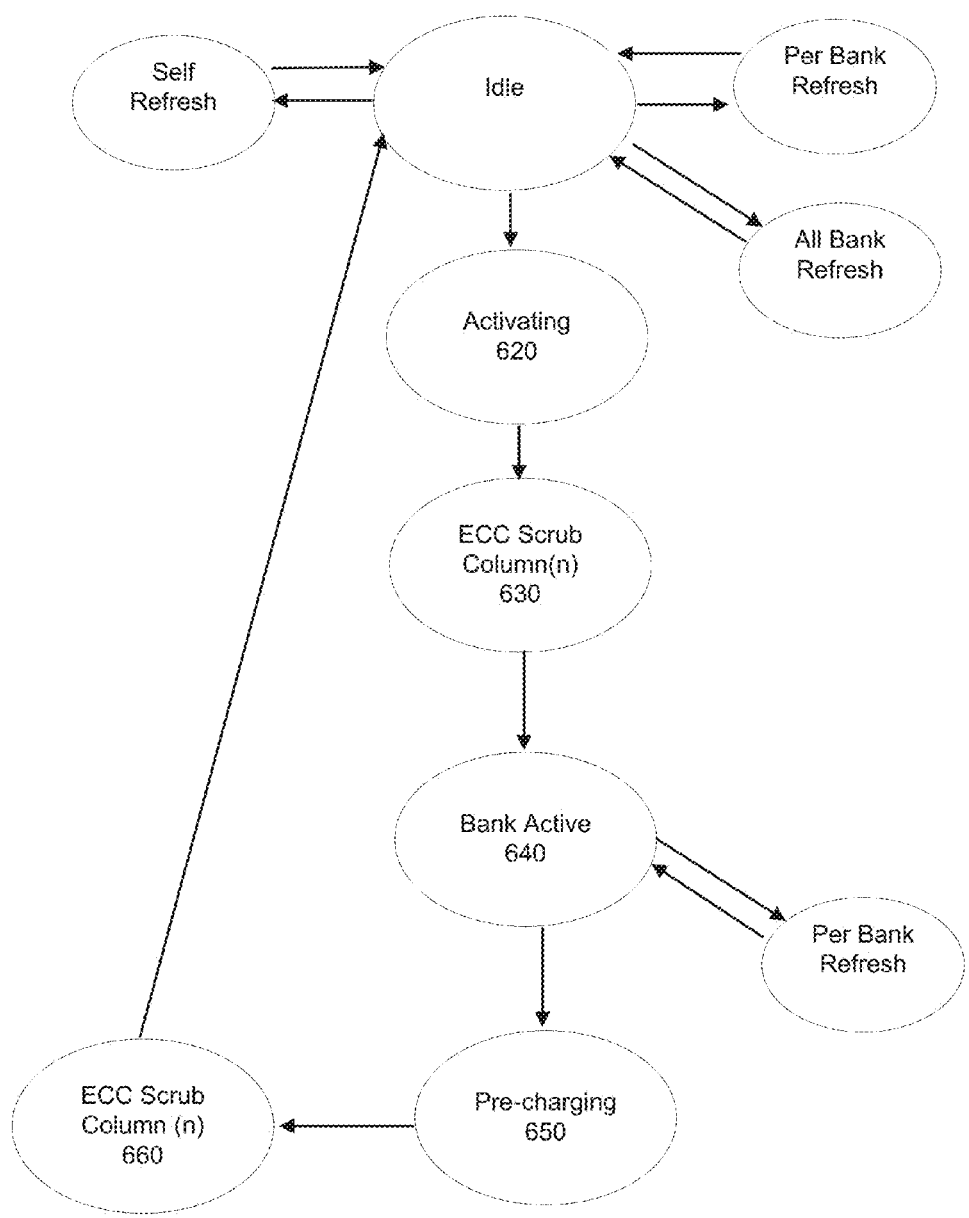
FIG. 6 is a state diagram illustrating the operation of a DRAM that can perform an ECC scrub during a row activate or pre-charge operation in accordance with an embodiment of the present invention.

FIG. 6 is a state diagram illustrating the operation of a DRAM that can perform an ECC scrub during a row activate or pre-charge operation in accordance with an embodiment of the present invention. In one embodiment of the present invention, error correction circuitry and logic can be added to the sense amplifiers so that either during a row activate or pre-charge operation, all of the row data can be checked (across all or a subset of columns) for bit errors. In this case, the errors can be fixed and written back to the row to correct for all data across the row. Over time, the entire active memory, as it is being used, will be checked and corrected for bit-errors. A controller can initiate this operation by using the existing DRAM protocol or by defining a new set of commands for this operation.

In this embodiment, directed and/or forced scrubbing is performed under memory controller control. In one embodiment, a tagged extension is created to the Activate and Precharge cycles where the memory controller provides the Bank and Row address but the DRAM provides the Column address internally. No read or write command is issued on the command bus as the recirculating repair operation is implicit (as will be explained further below). Accordingly, no bandwidth is consumed on the data bus.

While the embodiments discussed in relation with FIGS. 5 and 6 can be performed with minimal or no change to the hardware design of the DRAM, the embodiment of FIG. 6 would require making modifications to the DRAM design by adding error correction circuitry and logic to the sense amplifiers.

As shown in FIG. 6, in one embodiment, the memory controller can send an Activate with Scrub command to the DRAM. The Activate with Scrub command performs the ECC scrub on the row being activated into the sense amplifiers using newly added per-bank ECC logic. Accordingly, the scrub is performed in state 630 as part of transition to Activating State 620 and the Bank Active state 640. In one embodiment, the entire row is read and the ECC is checked for the row. If there is an error detected, the data is corrected. Subsequently, the ECC is re-computed and the corrected data is written into the sense amplifiers. The corrected data will then get updated into the memory during the pre-charge state 650. Accordingly, the row is error-corrected before a read or write operation can be performed on the activated row in state 640.

To perform an ECC scrub for an entire row simultaneously, however, this embodiment requires multiple ECC engines as compared to the prior embodiments. Accordingly, this embodiment may require modifying the hardware to include additional ECC engines. In one embodiment, the row can be split and the scrubbing of the row can be performed over multiple cycles (e.g., 2 or 4 cycles). Further, instead of a refresh column counter 431, this embodiment would require an internal column counter to be able to cycle through all the column addresses and use the ECC logic to correct any errors before writing the data back.

In one embodiment, the controller may be able to command the DRAM to perform a Precharge with Scrub. In this embodiment, instead of performing the ECC scrub during the reading of the row into the sense amplifiers, the ECC scrub is performed as the row is written back into the memory from the sense amplifiers during pre-charge. As shown in FIG. 6, the ECC scrub is performed in state 660 during pre-charging 650, prior to the bank transitioning into idle state. The ECC is checked for the row and if an error is detected, the data is corrected using the ECC bits. Subsequently, the ECC is re-computed and the corrected data is written back into memory from the sense amplifiers as part of the precharging process.

The controller, in one embodiment, can be programmed so that it performs a scrub each time there is an activation or pre-charge. This leads to a better bit error rate, however, it can create more latency and power performance issues. Alternatively, the controller can be programmed with commands that perform a scrub during periodic activate or pre-charge states, but not all. This provides a good efficiency and bit-rate trade-off. A system sensitive to efficiency can schedule less frequent scrubs while another may decide to increase scrub rate to reduce probability of errors.

Figure 7:
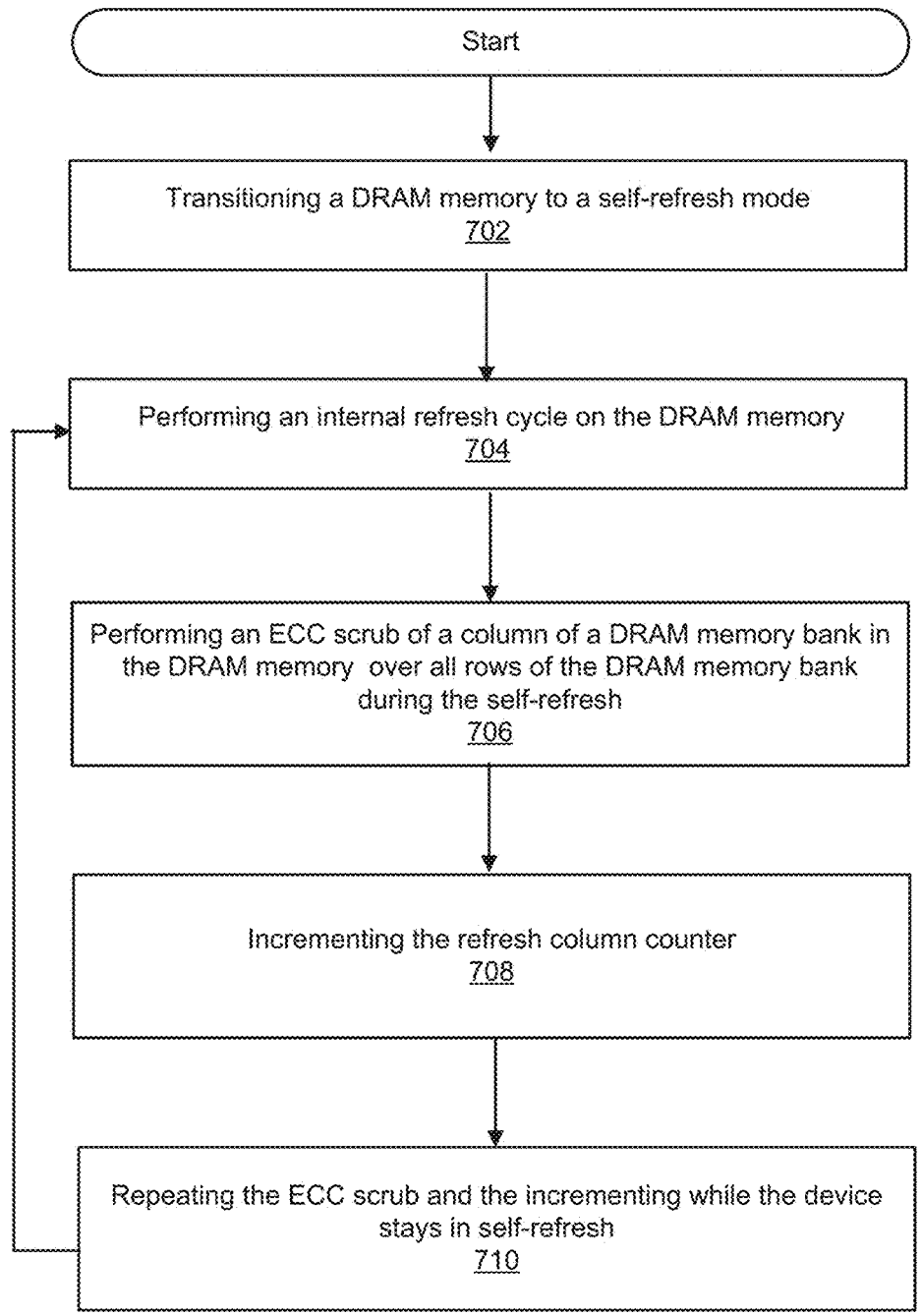
FIG. 7 shows a flowchart of an exemplary process of implementing an ECC scrub in a DRAM memory module in self-refresh mode in accordance with an embodiment of the present invention.

FIG. 7 shows a flowchart of an exemplary process of implementing an ECC scrub on a bank of a DRAM memory array in self-refresh mode in accordance with an embodiment of the present invention.

At step 702, the DRAM memory transitions into the low power self-refresh mode 445. At step 704, an internal refresh cycle is initiated by the DRAM on the memory array. It should be noted that this is an internal self-refresh cycle. In other words, the self-refresh cycle is triggered internally by the DRAM logic to perform a refresh cycle versus a refresh issued on the command interface from the memory controller. In order to perform the internal refresh in state 450 (as shown in FIG. 4) a row (or rows) need to first be Activated. Similarly, the refresh cycle is completed by Precharging previously activated pages.

At step 706, during the self-refresh cycle, an ECC scrub is performed on a column of a DRAM memory bank in state 460. In subsequent DRAM-initiated self-refresh cycles the ECC scrub continues over all the rows and banks of the DRAM memory as discussed above. In one embodiment, the ECC scrub can be performed over more than a single column during the self-refresh state. In other words, multiple "words" (or ECC words) can be scrubbed in a single self-refresh cycle.

At step 708, the refresh column counter is incremented by one ECC scrub word. Alternatively, if multiple ECC scrub words are scrubbed during a cycle, the refresh column counter is incremented accordingly.

At step 710, the ECC scrub and the incrementing is repeated while the device stays in self-refresh and the process loops back to step 704. As mentioned above, a self-refresh cycle is completed by Precharging previously activated pages.

Figure 8:
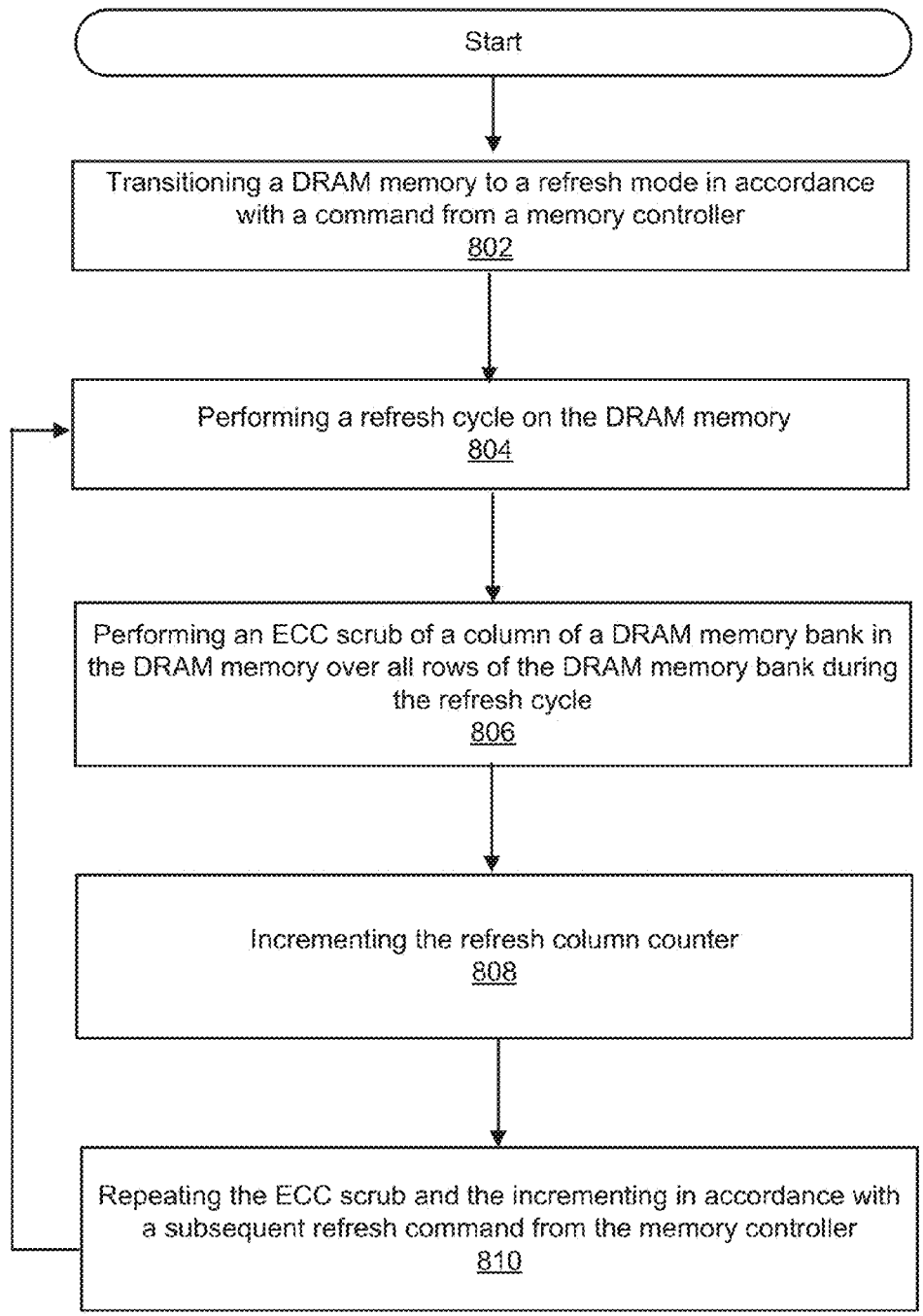
FIG. 8 shows a flowchart of an exemplary process of implementing an ECC scrub in a DRAM memory module in refresh mode as initiated by the memory controller in accordance with an embodiment of the present invention.

FIG. 8 shows a flowchart of an exemplary process of implementing an ECC scrub on a bank of a DRAM memory array in refresh mode as initiated by the memory controller in accordance with an embodiment of the present invention.

At step 802, the DRAM memory transitions into a refresh mode (e.g., per bank refresh 570 and 595 or all bank refresh 585) in accordance with an instruction from the memory controller. At step 804, a refresh cycle is initiated on the DRAM by ACTivating a page or pages. Similar to the self-refresh cycle, the refresh cycle initiated by the memory controller is completed by Precharging previously activated pages.

At step 806, during the refresh cycle, an ECC scrub is performed on a column of a DRAM memory bank. In subsequent Memory Controller-initiated refresh cycles the ECC scrub continues over all the rows of the DRAM as discussed above. In a different embodiment, the ECC scrub can be performed over more than a single column during the refresh cycle. As discussed above, the ECC scrub, in one embodiment, can be performed by issuing explicit Masked Write commands by the memory controller.

At step 808, the refresh column counter is incremented by one ECC scrub word when the current column has made one pass through the entire array. Alternatively, if multiple columns are scrubbed during a cycle, the refresh column counter is incremented accordingly.

At step 810, the ECC scrub is performed again for the subsequent column (or columns) during the next refresh cycle initiated by the memory controller and the counter is incremented accordingly.

Figure 9:
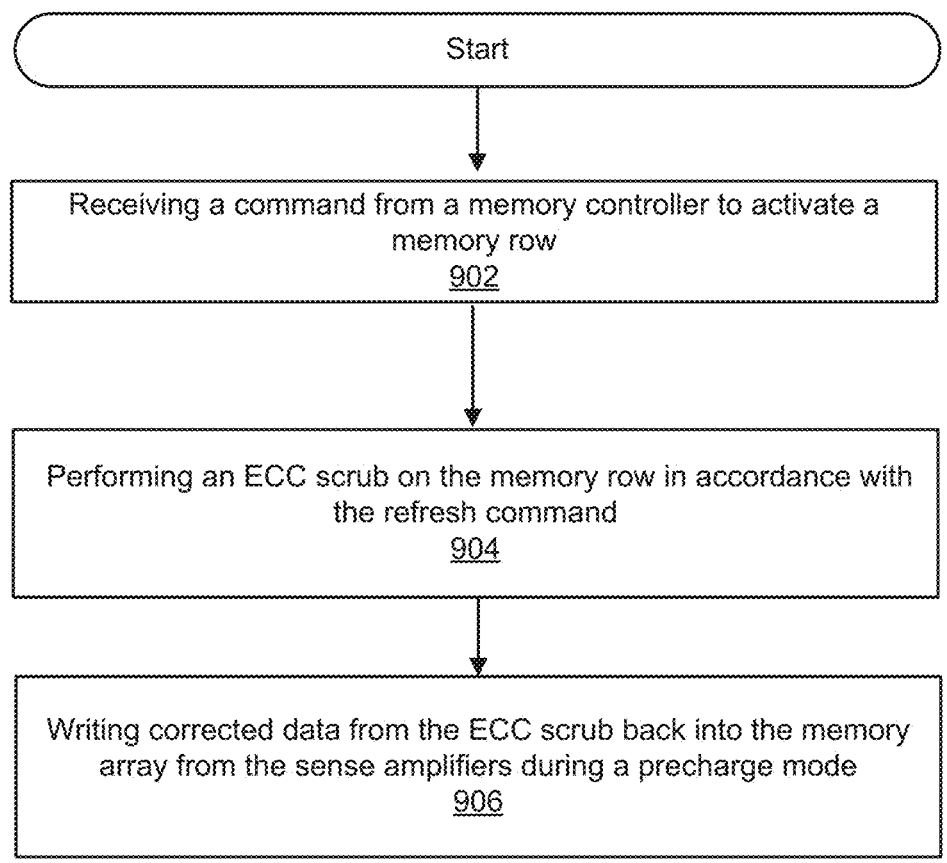
FIG. 9 shows a flowchart of an exemplary process of implementing an ECC scrub in a DRAM memory module during a row activate operation in accordance with an embodiment of the present invention.

FIG. 9 shows a flowchart of an exemplary process of implementing an ECC scrub in a DRAM memory module during a row activate operation in accordance with an embodiment of the present invention.

At step 902, a command is received from a memory controller to activate a memory row.

At step 904, an ECC scrub is performed on a column or columns of the memory row during the activate process in accordance with the activate command.

At step 906, corrected data following the ECC scrub is written back into the memory from the sense amplifiers during precharge mode.

Figure 10:
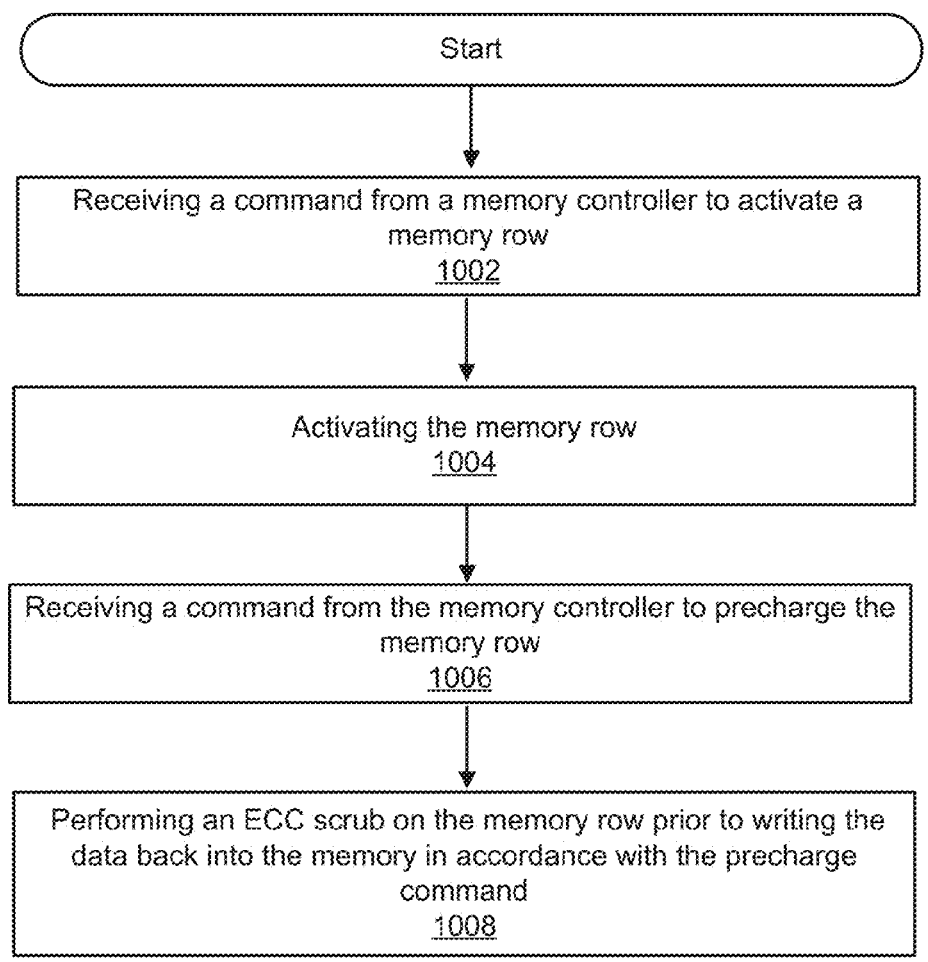
FIG. 10 shows a flowchart of an exemplary process of implementing an ECC scrub in a DRAM memory module during a row precharge operation in accordance with an embodiment of the present invention.

FIG. 10 shows a flowchart of an exemplary process of implementing an ECC scrub during a row precharge operation in accordance with an embodiment of the present invention.

At step 1002, a command is received from the memory controller to activate a memory row. At step 1004, the row is activated and data from the row is read into the sense amplifiers.

At step 1006, a command is received from the memory controller to precharge the memory row.

At step 1008, an ECC scrub is performed on a column or columns of the memory row prior to writing the corrected data back into the memory in accordance with the precharge command.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for updating a DRAM memory array, said method comprising:
   a) transitioning the DRAM memory array from an idle state to a self-refresh state;
   b) initiating a refresh on the DRAM memory array using DRAM internal control circuitry;
   c) during the refresh, performing an Error Correction Code (ECC) scrub operation of selected bits in an activated row of the DRAM memory array; and
   d) updating a refresh column counter.

2. The method of claim 1, further comprising:
   repeating the b) and c) for subsequent refresh operations to other rows in the DRAM memory array.

3. The method of claim 2, wherein updating the refresh column counter comprises selecting a different set of bits from the selected bits from a sense amplifier buffer of the DRAM memory array for a subsequent ECC scrub operation.

4. The method of claim 3, further comprising:
   repeating the c) and d) to select and perform an ECC scrub of subsequent bits in the activated row.

5. The method of claim 3, further comprising:
   repeating the b), c) and d) for subsequent refresh operations to perform an ECC scrub over all columns for all rows of the DRAM memory array.

6. The method of claim 3, wherein the ECC scrub operation comprises performing a virtual read and write operation to re-circulate selected data bits through an ECC repair module and store corrected data from the ECC repair module back in the sense amplifier buffer.

7. The method of claim 3, further comprising:
   performing an ECC scrub operation for remaining bits over a plurality of rows in the DRAM memory array during subsequent DRAM-initiated refresh cycles while in the self-refresh state.

8. The method of claim 5, further comprising:
   incrementing a bank counter to address a different portion of the DRAM memory array.

9. The method of claim 1, wherein the ECC scrub operation comprises:
   reading in the selected bits and corresponding ECC bits;
   checking the selected bits to determine if they are correct using the corresponding ECC bits;
   correcting the selected bits if the ECC bits indicate an error;
   re-computing the ECC bits for the selected bits; and
   writing corrected data and ECC bits back into a sense amplifier buffer of the DRAM memory array.

10. The method of claim 9, wherein an address of any detected error is stored in a temporary buffer or register.

11. The method of claim 5, wherein a time delay between internally generated refresh operations is adapted to accelerate scrubbing of multiple pages.

12. A method for updating a DRAM memory array, said method comprising:
    a) transitioning the DRAM memory array from an idle state to a self-refresh state;
    b) initiating a refresh on the DRAM memory array using DRAM internal control circuitry;
    c) during the refresh, performing an Error Correction Code (ECC) scrub operation of selected bits in an activated row of the DRAM memory array, wherein the selected bits comprise multiple words; and
    d) updating a refresh column counter.

13. The method of claim 12, further comprising:
    repeating the b) and c) for subsequent refresh operations to other rows in the DRAM memory array.

14. The method of claim 13 wherein updating the refresh column counter comprises selecting a different set of bits from the selected bits from a sense amplifier buffer of the DRAM memory array for a subsequent ECC scrub operation.

15. The method of claim 14, further comprising:
    repeating the c) and d) to select and perform an ECC scrub of subsequent bits in the activated row.

16. The method of claim 14, wherein the ECC scrub operation comprises performing a virtual read and write operation to re-circulate selected data bits through an ECC repair module and store corrected data from the ECC repair module back in the sense amplifier buffer.

17. The method of claim 14, further comprising:
    performing an ECC scrub operation for remaining bits over a plurality of rows in the DRAM memory array during subsequent DRAM-initiated refresh cycles while in the self-refresh state.

18. The method of claim 12, wherein the ECC scrub operation comprises:
    reading in the selected bits and corresponding ECC bits;
    checking the selected bits to determine if they are correct using the corresponding ECC bits;
    correcting the selected bits if the ECC bits indicate an error;
    re-computing the ECC bits for the selected bits; and
    writing corrected data and ECC bits back into a sense amplifier buffer of the DRAM memory array.

19. The method of claim 18, wherein an address of any detected error is stored in a temporary buffer or register.

20. An apparatus for updating a DRAM memory, the apparatus comprising:
    a DRAM memory array, wherein the DRAM memory array is configured to:
    a) transition the DRAM memory array to a self-refresh state from an idle state;
    b) initiate a refresh on the DRAM memory array using DRAM internal control circuitry; and
    c) during the refresh, performing an Error Correction Code (ECC) scrub operation of selected bits in an activated row of the DRAM memory array; and
    d) updating a refresh column counter to select a different set of bits from a sense amplifier buffer of the DRAM memory array for a subsequent ECC scrub operation.

* * * * *